United States Patent
Xiang et al.

(10) Patent No.: US 7,462,549 B2
(45) Date of Patent: Dec. 9, 2008

(54) SHALLOW TRENCH ISOLATION PROCESS AND STRUCTURE WITH MINIMIZED STRAINED SILICON CONSUMPTION

(75) Inventors: Qi Xiang, San Jose, CA (US); James N. Pan, Fishkill, NY (US); Jung-Suk Goo, Stanford, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 216 days.

(21) Appl. No.: 10/755,602

(22) Filed: Jan. 12, 2004

(65) Prior Publication Data

US 2005/0151222 A1    Jul. 14, 2005

(51) Int. Cl.
*H01L 21/76*    (2006.01)
(52) U.S. Cl. ....................... 438/424; 438/430
(58) Field of Classification Search ................. 438/424, 438/430
See application file for complete search history.

(56) References Cited

U.S. PATENT DOCUMENTS

| | | | |
|---|---|---|---|
| 5,254,873 A | 10/1993 | Poon et al. |
| 5,266,813 A | 11/1993 | Comfort et al. |
| 5,406,111 A | 4/1995 | Sun |
| 5,455,194 A | 10/1995 | Vasquez et al. |
| 5,668,044 A | 9/1997 | Ohno |
| 5,700,712 A | 12/1997 | Schwalke |
| 5,719,085 A | 2/1998 | Moon et al. |
| 5,793,090 A | 8/1998 | Gardner et al. |
| 5,837,612 A | 11/1998 | Ajuria et al. |
| 6,013,937 A | 1/2000 | Beintner et al. |
| 6,037,238 A | 3/2000 | Chang et al. |
| 6,074,930 A | 6/2000 | Cho et al. |
| 6,074,931 A | 6/2000 | Chang et al. |
| 6,080,618 A | 6/2000 | Bergner et al. |
| 6,080,627 A | 6/2000 | Fan et al. |
| 6,080,637 A | 6/2000 | Huang et al. |
| 6,087,705 A | 7/2000 | Gardner et al. |
| 6,107,143 A | 8/2000 | Park et al. |
| 6,136,664 A | 10/2000 | Economikos et al. |
| 6,146,970 A | 11/2000 | Witek et al. |
| 6,150,212 A | 11/2000 | Divakaruni et al. |
| 6,168,961 B1 | 1/2001 | Vaccari |

(Continued)

FOREIGN PATENT DOCUMENTS

EP    0 245 622 B1    11/1987

(Continued)

OTHER PUBLICATIONS

Takagi, S. et al., "Device structure and electrical characteristics of strained-Si-on-insulator (strained-SOI) MOSFETs," Materials Science and Engineering, 2002, pp. 426-434, B89, Elsevier.

(Continued)

*Primary Examiner*—Jack Chen
(74) *Attorney, Agent, or Firm*—Foley & Lardner LLP

(57) ABSTRACT

A method of manufacturing an integrated circuit (IC) utilizes a shallow trench isolation (STI) technique. The shallow trench isolation technique is used in strained silicon (SMOS) process. The strained material is formed after the trench is formed. The process can be utilized on a compound semiconductor layer above a box layer.

12 Claims, 8 Drawing Sheets

U.S. PATENT DOCUMENTS

| | | |
|---|---|---|
| 6,207,531 B1 | 3/2001 | Pen-Liang |
| 6,214,696 B1 | 4/2001 | Wu |
| 6,271,143 B1 | 8/2001 | Mendicino |
| 6,306,722 B1 | 10/2001 | Yang et al. |
| 6,391,731 B1 | 5/2002 | Chong et al. |
| 6,399,512 B1 | 6/2002 | Blosse et al. |
| 6,414,364 B2 | 7/2002 | Lane et al. |
| 6,426,278 B1 | 7/2002 | Nowak et al. |
| 6,456,370 B1 | 9/2002 | Ingles, Jr. |
| 6,468,853 B1 | 10/2002 | Balasubramanian et al. |
| 6,498,383 B2 | 12/2002 | Beyer et al. |
| 6,524,931 B1 | 2/2003 | Perera |
| 6,548,261 B1 | 4/2003 | Smith et al. |
| 6,548,361 B1 | 4/2003 | En et al. |
| 6,566,228 B1 | 5/2003 | Beintner et al. |
| 6,613,646 B1 | 9/2003 | Sahota et al. |
| 6,646,322 B2 | 11/2003 | Fitzgerald |
| 6,656,749 B1 | 12/2003 | Paton et al. |
| 6,673,696 B1 | 1/2004 | Arasnia et al. |
| 6,706,581 B1 | 3/2004 | Hou et al. |
| 6,878,606 B2 * | 4/2005 | Ohnishi et al. ............... 438/424 |
| 6,962,857 B1 | 11/2005 | Ngo et al. |
| 2002/0045312 A1 | 4/2002 | Zheng et al. |
| 2002/0098689 A1 | 7/2002 | Chong et al. |
| 2003/0049893 A1 | 3/2003 | Currie et al. |
| 2003/0139051 A1 | 7/2003 | Andideh et al. |
| 2004/0036142 A1 | 2/2004 | Shima |
| 2004/0061161 A1 | 4/2004 | Radens et al. |
| 2004/0089914 A1 | 5/2004 | Mouli et al. |
| 2004/0132267 A1 | 7/2004 | Sadana et al. |
| 2004/0135138 A1 | 7/2004 | Hsu et al. |
| 2004/0137742 A1 * | 7/2004 | Ngo et al. ................... 438/700 |
| 2004/0142537 A1 | 7/2004 | Lee et al. |
| 2004/0180509 A1 | 9/2004 | Wang et al. |

FOREIGN PATENT DOCUMENTS

| | | |
|---|---|---|
| GB | 2 254 731 A | 10/1992 |
| WO | WO 02/095818 A1 | 11/2002 |
| WO | WO 02/101818 A2 | 12/2002 |
| WO | WO 03/094208 A2 | 11/2003 |
| WO | WO 03/094208 A3 | 11/2003 |
| WO | WO 2004/061920 A2 | 7/2004 |
| WO | WO 2004/061920 A3 | 7/2004 |

OTHER PUBLICATIONS

Takagi, Shin-Ichi et al., "Strained SOI Technology for High-Performance, Low-Power CMOS Applications," 2003 IEEE International Solid-State Circuits Conference, Feb. 12, 2003, 9 pages, 0-7803-7707-9/03.

International Search Report and Written Opinion for Application No. PCT/US2004/043107, date of mailing Apr. 10, 2005, 17 pages.

International Preliminary Report on Patentability for PCT/US2004/007464, dated Jan. 7, 2005, 8 pages.

International Search Report; International Application No. PCT/US2004/007464; mailed Sep. 1, 2004; 3 pgs.

Written Opinion of the International Searching Authority; International Application No. PCT/US2004/007464; International Filing Date Mar. 11, 2004; 6 pgs.

International Search Report for PCT/US2004/000982, 4 pages.

Written Opinion of the International Searching Authority; International Application No. PCT/US2004/000982; International Filing Date Jan. 13, 2004; 6 pgs.

Ghandhi, Sorab K. "VSLI Fabrication Principles"; John Wiley and Sons; 1983; pp. 422-423.

Ohkubo, Satoshi; Tamura Yasuyuki; Sugino, Rinji; Nakanishi, Toshiro; Sugita, Yoshihiro; Awaji, Naoki and Takasaki, Kanetake; "High Quality Ultra-Thin (4nm) Gate Oxide by $UV/O_3$ Surface Pre-Treatment of Native Oxide"; 1995 Symposium On VLSI Technology; Digest of Technical Papers; Jun. 6-8, 1995; Kyoto, Japan; 3 pgs.

Rim, K., Welser, J., Hoyt, J.L., and Gibbons, J.F., "Enhanced Hole Mobilities in Surface-channel Strained-Si $p$-MOSFETs", 1995 International Electron Devices Meeting Technical Digest, 5 pages.

Van Zant, Peter, "Microchip Fabrication", McGraw Hill, 1977, pp. 31 and 39.

Vossen, John L., Thin Film Processes II, Academic Press, 1991, p. 333.

Welser, J., Hoyt, J.L., Takagi, S. and Gibbons, J.F., "Strain Dependence of the Performance Enhancment in Strained-Si $n$-MOSFETs", 1994 International Electron Devices Meeting Technical Digest, San Francisco, CA Dec. 11-14, 1994, 5 pages.

Wolf, Stanley, Ph.D. and Tauber, Richard N., Ph.D.; "Silicon Processing For The VLSI Era"; vol. 1: Process Technology; Lattice Press; 1986; pp. 57-58, 194.

International Preliminary Report on Patentability for International Application No. PCT/US2004/043107; completed Jun. 21, 2006; 11 pages.

Response to Written Opinion and Chapter II Demand for International Application No. PCT/US2004/043107; dated Dec. 19, 2005; 4 pages.

* cited by examiner

SHALLOW TRENCH ISOLATION PROCESS AND STRUCTURE WITH MINIMIZED STRAINED SILICON CONSUMPTION

CROSS REFERENCE TO RELATED APPLICATIONS

The present application is related to U.S. application Ser. No. 10/358,966 by Ngo, et al., filed on Feb. 5, 2003; U.S. application Ser. No. 10/389,456 by Wang et al., filed on Mar. 14, 2003; U.S. application Ser. No. 10/341,863 by Ngo et al., filed on Jan. 14, 2003; and U.S. application Ser. No. 10/341,848 by Arasnia et al., filed on Jan. 14, 2003.

FIELD OF THE INVENTION

The present invention is related to integrated circuit (IC) devices and to processes of making IC devices. More particularly, the present invention relates to a method of forming trench isolation structures on substrates or layers including strained layers such as strained silicon.

BACKGROUND OF THE INVENTION

Integrated circuits (ICs) include a multitude of transistors formed on a semiconductor substrate. Various methods of forming transistors are known in the art. Generally, transistors are isolated from each other by insulating or isolation structures.

One method of forming transistors on a silicon substrate involves the well-known Local Oxidation of Silicon (LOCOS) process. A conventional LOCOS process typically includes the following simplified steps. First, a silicon nitride layer is thermally grown on the silicon substrate. Generally, conventional LOCOS processes require a high quality, thermally grown silicon nitride layer to avoid delamination and other processing problems. Next, using a lithography and etch process, the nitride layer is selectively removed to produce a pattern where transistor source/drain areas are to be located. After patterning the source/drain areas, a field oxide is grown. As oxide growth is inhibited where the nitride layer still remains, the field oxide only grows on the silicon substrate exposed during the source/drain patterning step. Finally, after oxide growth is complete, the remaining portions of the nitride layer are removed, leaving only the oxidized source/drain areas on the exposed silicon substrate.

Another process for forming insulating structures and defining source and drain regions is a shallow trench isolation (STI) process. A conventional STI process typically includes the following simplified steps. First, a silicon nitride layer is thermally grown or deposited onto the silicon substrate. Next, using a lithography and etch process, the silicon nitride layer is selectively removed to produce a pattern where transistor source/drain areas are to be located. After patterning the source/drain areas, the substrate is etched to form trenches. After the trenches are formed, a liner is thermally grown on the exposed surfaces of the trench. The liner oxide is typically formed at a very high temperature in a hydrochloric (HCl) acid ambient. An insulative material such as silicon dioxide ($SiO_2$) is blanket deposited over the nitride layer and the liner oxide within the trench. The insulative material is polished to create a planar surface. The nitride layer is subsequently removed to leave the oxide structures within the trenches.

Shallow trench isolation (STI) structures are utilized in strained silicon (SMOS) processes. SMOS processes are utilized to increase transistor (MOSFET) performance by increasing the carrier mobility of silicon, thereby reducing resistance and power consumption and increasing drive current, frequency response, and operating speed. Strained silicon is typically formed by growing a layer of silicon on a silicon-germanium substrate or layer.

The silicon-germanium lattice associated with the silicon-germanium substrate is generally more widely spaced than a pure silicon lattice, with spacing becoming wider with a higher percentage of germanium. Because the silicon lattice aligns with the larger silicon-germanium lattice, a tensile strain is created in the silicon layer. The silicon atoms are essentially pulled apart from one another.

Relaxed or non-strained silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

In conventional SMOS processes, a strained silicon layer is provided over a silicon-germanium layer and etched to form trenches for the STI structure. The trenches extend through the strained silicon layer and at least partially into the silicon-germanium layer. A conventional STI liner oxide process is utilized to grow a trench liner. The conventional STI liner oxide process can utilize very high temperatures and HCl ambient environments. During this process, germanium outgassing is enhanced, which can negatively impact the formation of thin films, can contaminate IC structures, layers and equipment, and can cause germanium accumulation or "pile-up" at the interface of the liner, thereby causing reliability issues for the STI structure.

In conventional SMOS processes, the STI structure can be subject to silicon overhang at the edge of the STI structure because the silicon-germanium layer is more readily etched than the strained silicon layer. Further, the strained silicon layer is more easily consumed than the silicon-germanium layer during trench liner and filling processes. In addition, conventional SMOS STI trenches can be subject to STI sidewall leakage.

Thus, there is a need for an STI structure which can be formed without damaging strained materials or layers. Further still, there is a need for a process of forming high quality oxides with good compatibility that are not susceptible to problems associated with strained materials. Further still, there is a need for an improved SMOS trench formation process that is not susceptible to silicon overhang. Yet further, there is a need for a liner formation process that is less susceptible to germanium outgassing. Further, there is a need for an STI process that is less susceptible to at least one of strained silicon consummation, STI sidewall leakage, and silicon overhang.

SUMMARY OF THE INVENTION

An exemplary embodiment relates to a method of manufacturing an integrated circuit having trench isolation regions in a substrate including a first layer. The method includes selectively etching the first layer to form apertures associated with locations of the trench isolation regions and forming strained semiconductor material above the first layer. The method also includes forming insulative material in the apertures to form the trench isolation regions.

Another exemplary embodiment relates to a method of forming shallow trench isolation structures in a compound semiconductor layer above a buried oxide (BOX) layer. The method includes providing a hard mask layer above the compound semiconductor layer, removing the hard mask layer at locations, and forming trenches in the compound semiconductor layer under the locations. The method also includes stripping the hard mask layer, forming a strained semiconductor layer above the compound semiconductor layer, and providing isolation material in the trenches to form the shallow trench isolation structures.

Still another exemplary embodiment relates to an integrated circuit. The integrated circuit includes a compound semiconductor layer, a box layer beneath the compound semiconductor layer, a strained semiconductor layer, and isolation trenches. The strained semiconductor layer is above the compound semiconductor layer. The isolation trenches are disposed in the compound semiconductor layer. The isolation trenches include insulative material and sidewalls of the isolation trenches are at least partially covered by the strained semiconductor layer.

BRIEF DESCRIPTION OF THE DRAWINGS

Exemplary embodiments will become more fully understood from the following detailed description, taken in conjunction with the accompanying drawings, wherein like reference numerals refer to like parts, and wherein.

DETAILED DESCRIPTION OF REFERRED EXEMPLARY EMBODIMENTS

Figure 1:
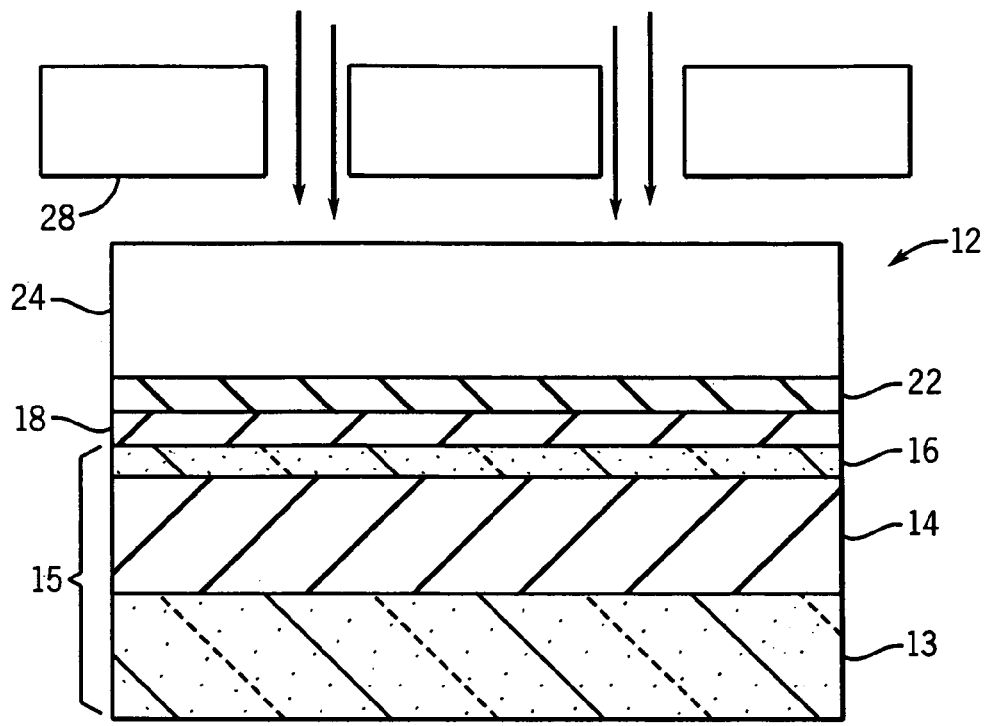
FIG. 1 is a schematic cross-sectional view of a portion of a semiconductor-on-insulator (SOI) substrate including an oxide layer, a hard mask layer, and a photoresist layer for use with exemplary embodiments of the shallow trench isolation (STI) processes illustrated in FIGS. 10 and 15.

FIGS. 1 through 15 illustrate methods of manufacturing an integrated circuit (IC) in accordance with an exemplary embodiment. Advantageously, process 100 (FIG. 10) and process 200 (FIG. 15) do not provide the strained silicon material until after the trenches are formed in an underlying layer. In this way, problems associated with silicon overhang at the STI edge, strained silicon consumption for formation of the STI structure, and STI structure sidewall leakage are reduced. The strained material can be provided according to a variety of processes after trenches are formed in the underlying layer.

The embodiments of the method (process 100) illustrated in FIGS. 1 through 9 reduce germanium outgassing and out-diffusion problems associated with silicon-germanium layers. Process 100 utilizes a strained silicon layer on sidewalls at the STI trench.

Processes 100 and 200 can be used in a shallow trench isolation (STI) process or any process requiring trench isolation and utilizing germanium or other substances prone to outgassing at high temperatures. Advantageously, a liner oxide layer can be formed at a relatively low temperature and yet still provide a high quality oxide with good compatibility. A low temperature process refers to a process performed at a temperature of less than approximately 750° C. (e.g., at or below 700° C.).

Referring to FIGS. 1 through 10, a cross-sectional view of a portion 12 of an integrated circuit (IC) is illustrated. Portion 12 is subjected to process 100 (FIG. 10) to form a shallow trench isolation (STI) structure. Portion 12 includes an oxide layer 18 provided over a substrate 15. Substrate 15 includes a compound semiconductor layer 16 (e.g. silicon-germanium) provided over a buried oxide (BOX) layer 14 and a base layer 13. Substrate 15 is preferably a semiconductor-on-insulator (SOI) substrate including layer 16.

Base layer 13 is optional and portion 12 can be provided with BOX layer 14 as the bottom-most layer. Base layer 13 of substrate 15 can be the same material or a different material than layer 16. In one embodiment, base layer 13 is a semiconductor substrate such as a silicon substrate upon which layer 14 has been grown or deposited as a silicon dioxide layer. Layer 16 is grown or deposited physically above layer 14. Layer 16 is not necessarily directly deposited above layer 14. Alternatively, substrate 15 can be purchased from a wafer supplier.

Portion 12 can be any type of semiconductor device, or portion thereof, and may be made from any of a variety of semiconductor processes, such as a complementary metal oxide semiconductor (CMOS) process, bipolar process, or other semiconductor process. Portion 12 may be an entire IC or a portion of an IC and may include a multitude of electronic component portions.

Layer 16 is preferably a silicon-germanium or other semiconductor material including germanium, and can be doped with P-type dopants or N-type dopants. Layer 16 can be an epitaxial layer provided on a semiconductor or an insulative base such as layer 14. Furthermore, layer 16 is preferably a composition of silicon and germanium ($Si_{1-X}Ge_X$, where X is approximately 0.2 and is more generally in the range of 0.1-0.3).

Layer 14 can be grown, deposited, or formed by ion implantation above base layer 13. Layer 14 is preferably between approximately 200 and 2000 Å thick. According to alternative embodiments, layer 14 may have a thickness of between approximately 500 and 2000°, (e.g., if layer 14 is a SIMOX layer, oxygen implantation into silicon).

In one embodiment, layer is grown above base layer 13 by chemical vapor deposition (CVD) using disilane ($Si_2H_6$) and germane ($GeH_4$) as source gases with a substrate temperature of 650° C., a disilane partial pressure of 30 mPa, and a germane partial pressure of 60 mPa. Growth of silicon-germanium material may be initiated using these ratios, or alternatively, the partial pressure of germanium may be gradually increased beginning from a lower pressure or zero pressure to form a gradient composition. Alternatively, a silicon layer can be doped by ion implantation with germanium or other processes can be utilized to form layer 16. Preferably, layer 16 is grown by epitaxy to a thickness of less than approximately 2 microns (and preferably between approximately 0.5 microns and 2 microns.

Pad oxide film or oxide layer 18 is provided above layer 16. Layer 18 is optional. Layer 18 is preferably thermally grown on layer 16 to a thickness of between approximately 100 and 300 Å. Layer 18 serves as a buffer layer and can be thermally grown in a conventional high temperature process by heating to approximately 1000° C. in an oxygen-containing atmosphere.

A barrier or hard mask layer 22 is provided over oxide layer 18. Preferably, mask layer 22 is silicon nitride ($Si_3N_4$) provided at a thickness of between approximately 300 and 1000 Å by a deposition, CVD, or thermal growth process. A low pressure, plasma enhanced chemical vapor deposition (PECVD) process can also be utilized. A conventional thermal nitride process using a dichlorosilane ($SiH_2Cl_2$), ammonia ($NH_3$) and nitrogen ($N_2$) mixture at a high temperature (e.g., 600° C. or above) can be used. The PECVD process for depositing nitride uses silane ($SiH_4$), nitrogen ($N_2$), and ammonia ($NH_3$) with a power of between approximately 550 and 650 watts at 400° C. An ammonia ($NH_3$) silane ($SiH_4/N_2$) mixture plasma, as opposed to a $N_2/NH_3/SiCl_2H_2$ associated with conventional CVD or growth process, can be used to form mask layer 22.

Figure 2:
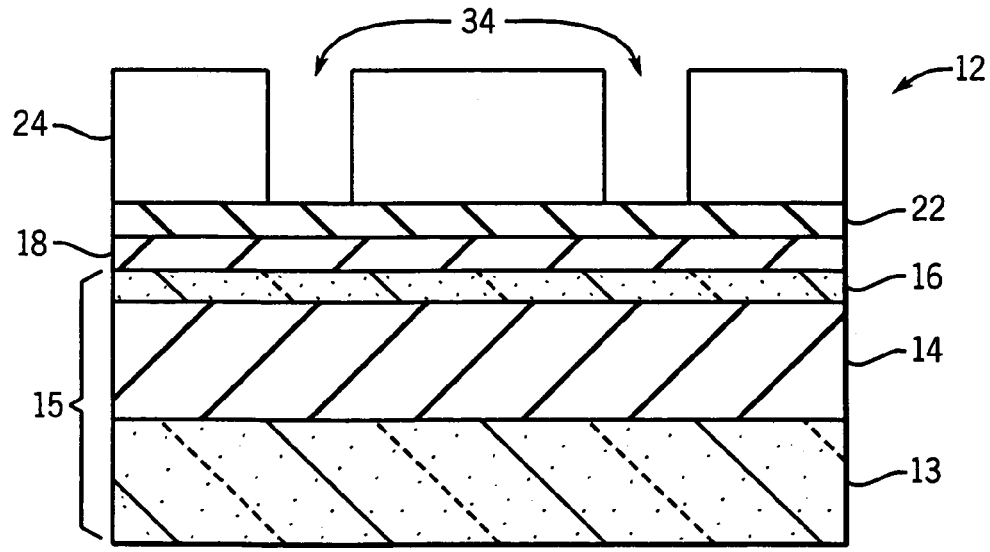
FIG. 2 is a cross-sectional view of the portion illustrated in FIG. 1, showing a lithographic patterning step.

A photoresist layer 24 is provided (e.g., by spin-coating) above mask layer 22. Preferably, photoresist layer 24 is any commercially available i-line or deep UV photoresist such as (Shipley Corp., MA) SPR 955 (i-line) UV5 (deep UV). In FIGS. 1-2, photoresist layer 24 is selectively removed via a photolithographic process using a mask or reticle 28 to leave apertures 34 in accordance with a step 102 (FIG. 10) of process 100.

Figure 3:
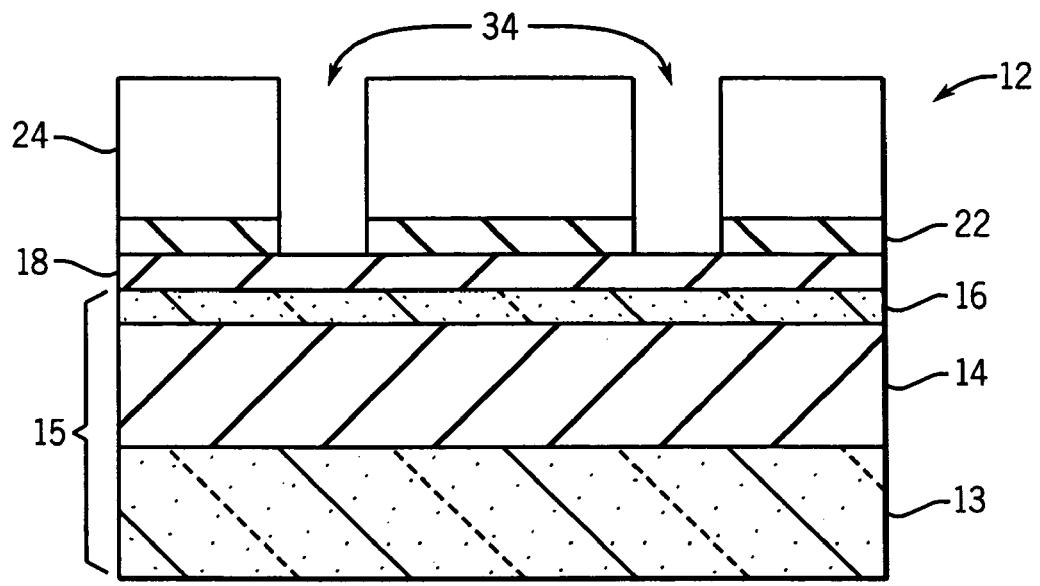
FIG. 3 is a cross-sectional view of the portion illustrated in FIG. 2, showing a selective etching step for the hard mask layer.
Figure 10:
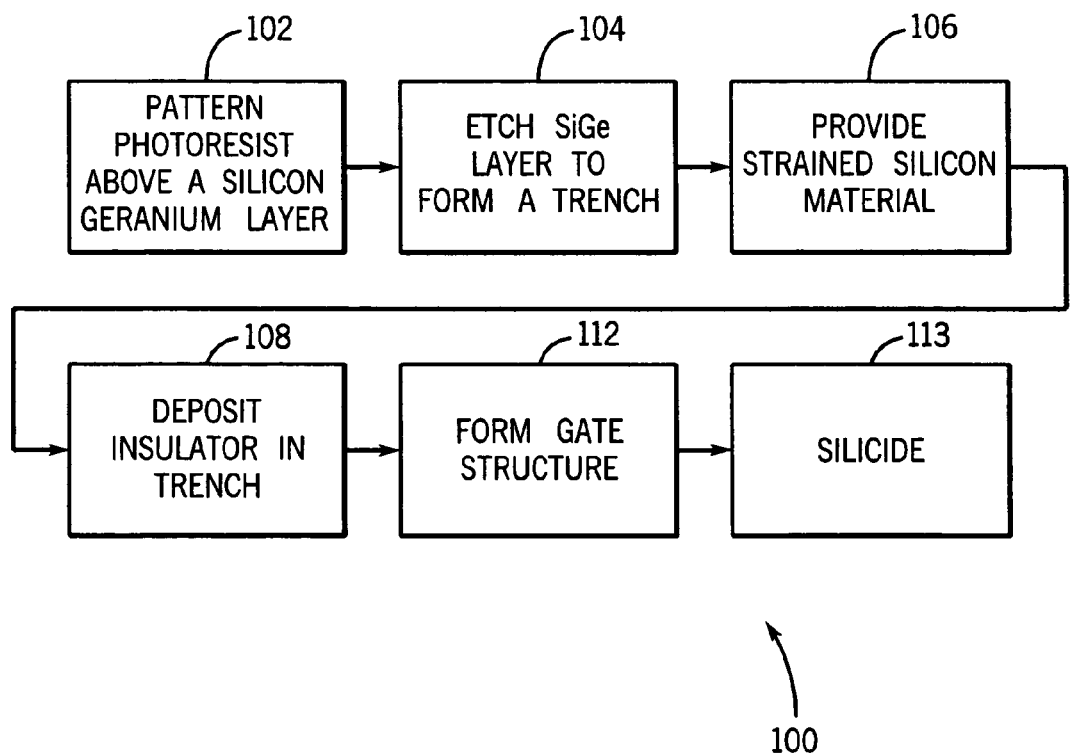
FIG. 10 is a general block diagram showing a shallow trench isolation process for the portion illustrated in FIGS. 1-9.

In FIG. 3, mask layer 22 is preferably a hard mask and is etched via a dry-etching process so that apertures 34 reach oxide layer 18 in accordance with a step 104 of process 100 (FIG. 10). The dry-etching process is selective to silicon nitride with respect to oxide layer 18. Layer 24 can be stripped after layer 22 is etched.

Figure 4:
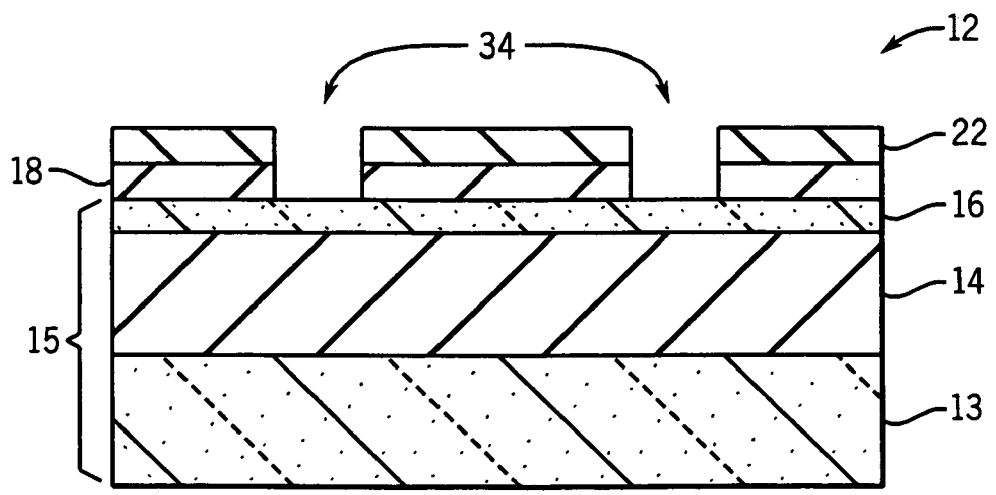
FIG. 4 is a cross-sectional view of the portion illustrated in FIG. 3, showing a selective etching step for the oxide layer.

In FIG. 4, the etch process is changed to etch through silicon dioxide material and layer 18 is etched so that apertures 34 reach layer 16 in accordance with step 104 of process 100 (FIG. 10). Layer 18 can be etched in a dry etching process. Alternatively, other etching techniques can be utilized to remove selected portions of layer 18. Photoresist layer 24 (FIG. 1) can be removed before or after oxide layer 18 is etched. Layer 22 can also be removed after layer 18 is etched.

Figure 5:
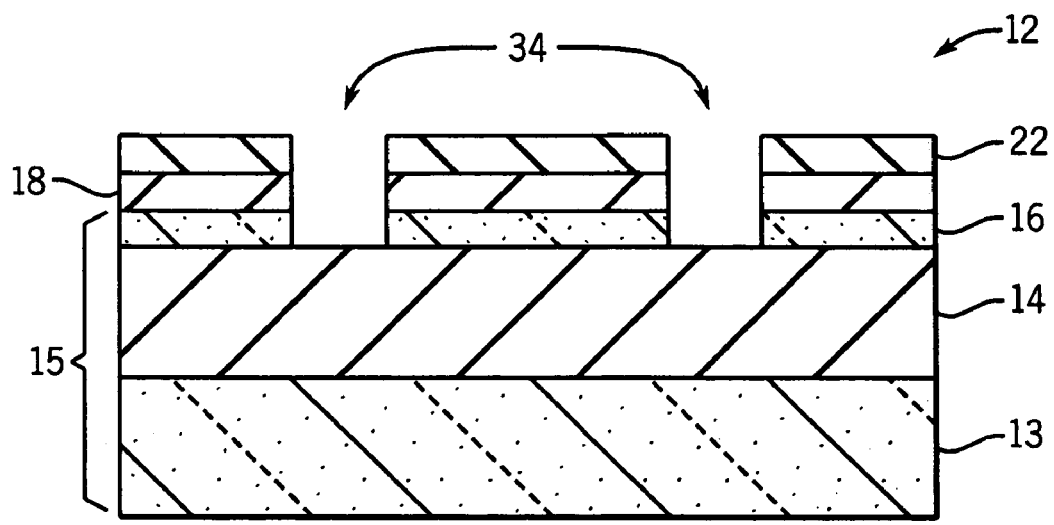
FIG. 5 is a cross-sectional view of the portion illustrated in FIG. 4, showing a selective etching step for a compound semiconductor layer associated with the SOI substrate.

In FIG. 5, the etch process is changed to etch through the compound semiconductor material of layer 16. Layer 16 can be removed in accordance with a dry-etching process so that apertures 34 reach a top of layer 14. Apertures 34 can be any width suitable for STI structures. In one embodiment, apertures 34 are preferably between approximately 150 nm and 300 nm wide depending upon technology. Layer 16 is etched through apertures 34 to form trenches for shallow trench isolation structures in accordance with step 104 of process 100 (FIG. 10). The trenches preferably have a width corresponding to apertures 34. The trenches preferably have a depth of between approximately 500 and 300 Å(depending on thickness of layer 16) and width of 150-300 nm. The trenches can have a trapezoidal cross-sectional shape with the narrower portion being at the bottom. An alternative embodiment includes trenches having a more rectangular cross-sectional shape.

Although described as being etched in a dry etching process, the trenches can be formed in any process suitable for providing apertures in layer 16. In one embodiment, the apertures for the trenches are provided all the way into layer 14. Alternatively, the bottom of the trenches associated with apertures 34 may not reach layer 14, depending upon the thickness of layer 16.

Figure 6:
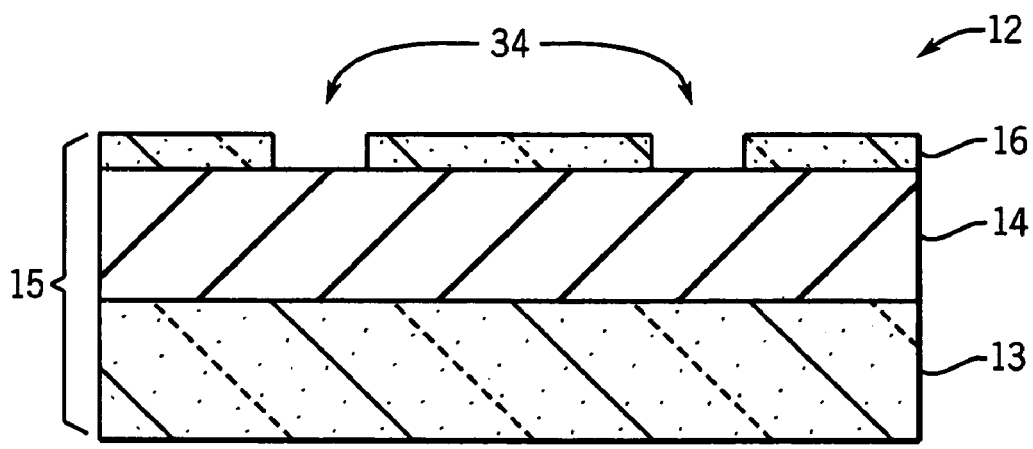
FIG. 6 is a cross-sectional view of the portion illustrated in FIG. 5, showing a removal step for the hard mask layer and the oxide layer.
Figure 7:
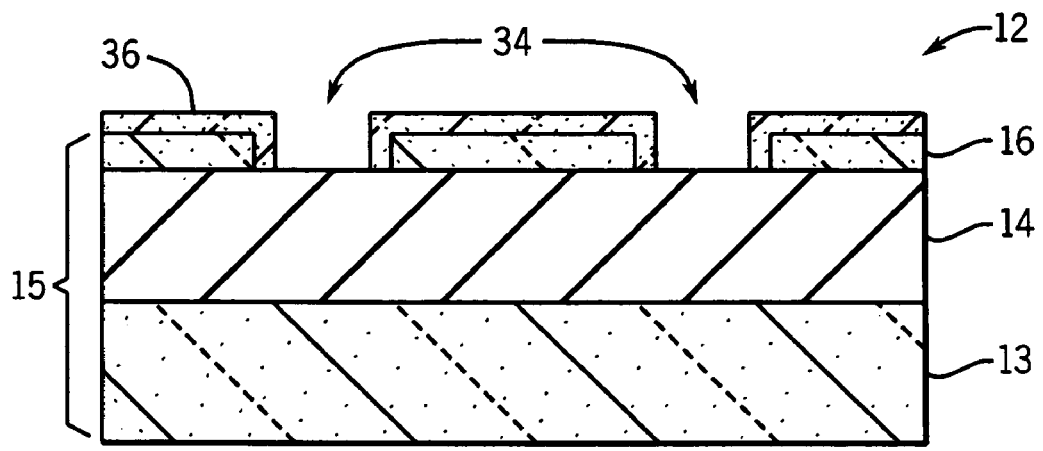
FIG. 7 is a cross-sectional view of the portion illustrated in FIG. 6, showing a strained semiconductor formation step.

In FIG. 6, layers 18 and 22 are removed (e.g., stripped). Layers 18 and 22 can be removed using any conventional process. In FIG. 7, strained semiconductor material 36 is provided above layer 16 in accordance with a step 106 of process 100 (FIG. 10). Layer 36 preferably has a thickness of between 100 and 200 Å and is a tensile-strained silicon layer. Layer 36 can be formed by chemical vapor deposition CVD using silane, disilane or dichlorosilane at a temperature of 500°to 650° C. or by molecular beam epitaxy (MBE).

In one preferred embodiment, sidewalls of the trenches associated with apertures 34 are covered with layer 36. Advantageously, layer 36 can prevent germanium diffusion associated with the STI trench process because it covers compound semiconductor layer 16. Layer 36 can be deposited by a number of processes including CVD and MBE and may have a variety of dimensions.

Liners (not shown) can be formed in the trenches associated with apertures 34 after layer 36 is provided. Preferably, the liners are oxide (e.g., silicon oxide or silicon dioxide) material formed in a low temperature process. In one embodiment, liners are between approximately 50 and 200 Å thick and are provided over the bottom and sidewalls of the trench.

In another embodiment, the liners can be formed in a plasma enhanced low pressure chemical vapor deposition (LPCVD) process or high density plasma oxide deposition (HDP) process similar to the CVD process discussed above. Preferably, the deposition processes do not utilize NH3, instead utilizing silane at a temperature below 700° C.

Figure 8:
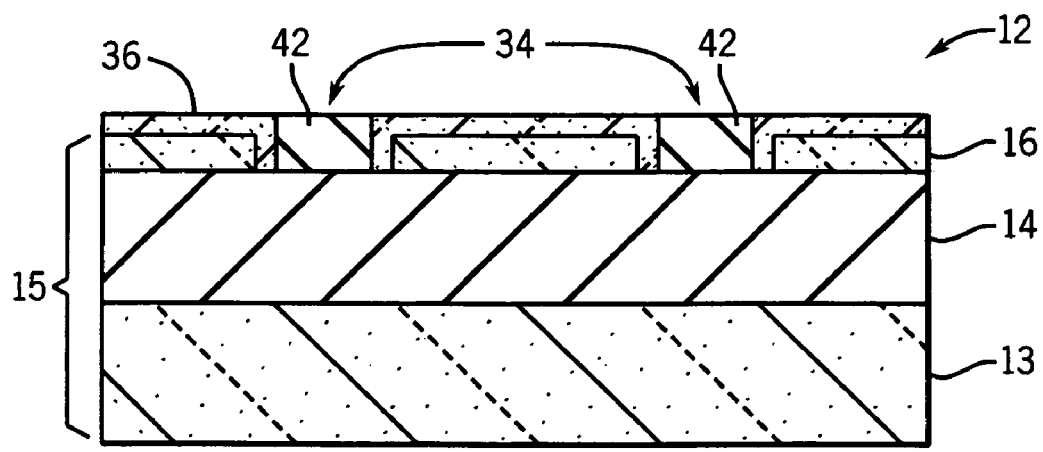
FIG. 8 is a cross-sectional view of the portion illustrated in FIG. 7, showing a trench fill step.
Figure 9:
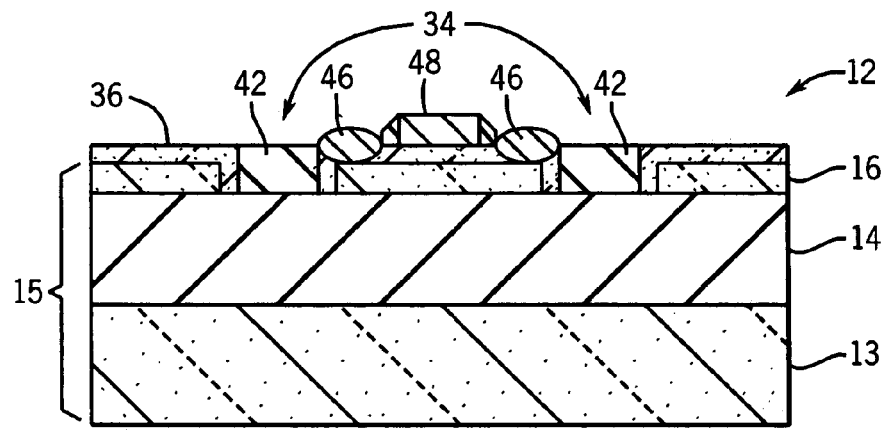
FIG. 9 is a cross-sectional view of the portion illustrated in FIG. 7, showing a gate formation and silicidation step.

In FIG. 8, a layer of insulative material 42 is blanket deposited over material 36 and within the trenches associated with apertures 34 in accordance with step 108 of process 100. Insulative material 42 is preferably silicon dioxide deposited in a CVD process. Preferably, insulative material 42 is deposited in a tetraethylorthosilicate (TEOS) process. Alternatively, a boron phosphate silicon glass (BPSG) process can be utilized. Insulative material 42 is preferably between approximately 2000 and 8000 Å thick.

Insulative material 42 is removed by polishing and/or etching until a top surface of material 36 is reached. The removal of insulative material 42 leaves insulative material within the trenches associated with apertures 34. Insulative material 42 can be removed by a number of stripping or etching processes. Preferably, insulative material 42 is removed from above material 36 by dry-etching.

After insulative material 42 is provided in the trenches associated with apertures 34, a gate structure 48 can be provided. Gate structure 48 can be a conventional MOSFET gate structure such as a metal over oxide gate structure or polysilicon over oxide gate structure.

Silicidation is utilized to form suicide layers 46 at locations of the source and drain of the transistor associated with gate structure 48. Layers 46 can be formed by a conventional germano-silicidation process using nickel.

With reference to FIGS. 1-5 and 11-15, process 200 is similar to process 100. Process 200 follows essentially the same steps associated with process 100 described with reference to FIGS. 1-5. In process 200, photoresist layer 24 is patterned above compound semiconductor layer 16 at a step 202 and the compound semiconductor layer is etched to form a trench at a step 204 (see FIGS. 1-5).

Figure 11:
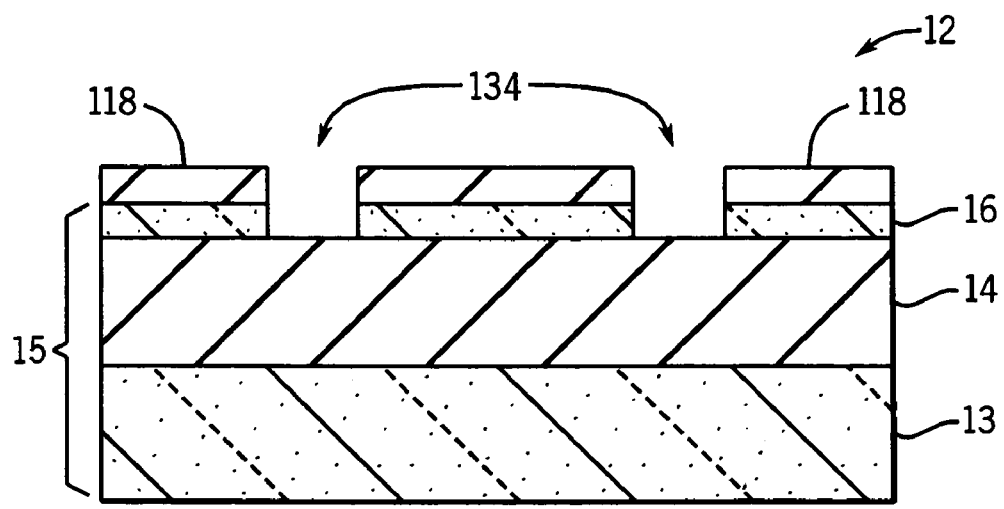
FIG. 11 is a cross-sectional view of a portion of a semiconductor-on-insulator substrate for use with exemplary embodiments of the shallow trench insulation (STI) process illustrated in FIG. 15, showing oxide and hard mask removal steps.

With reference to FIG. 11, apertures 134 in layer 16 can be slightly smaller than apertures 34 discussed with reference to FIGS. 2-9. Preferably, apertures 134 are between approximately 150 and 300 nm wide and have a similar depth to the depth of apertures 34 discussed above. A mask layer 118 (e.g., an oxide or nitride mask layer such as that described with respect to layers 18 and 22 described above) is provided over layer 16. The mask layer 118 has a thickness that is substantially similar to a strained material 136 (FIG. 13) that will be provided subsequently.

Figure 12:
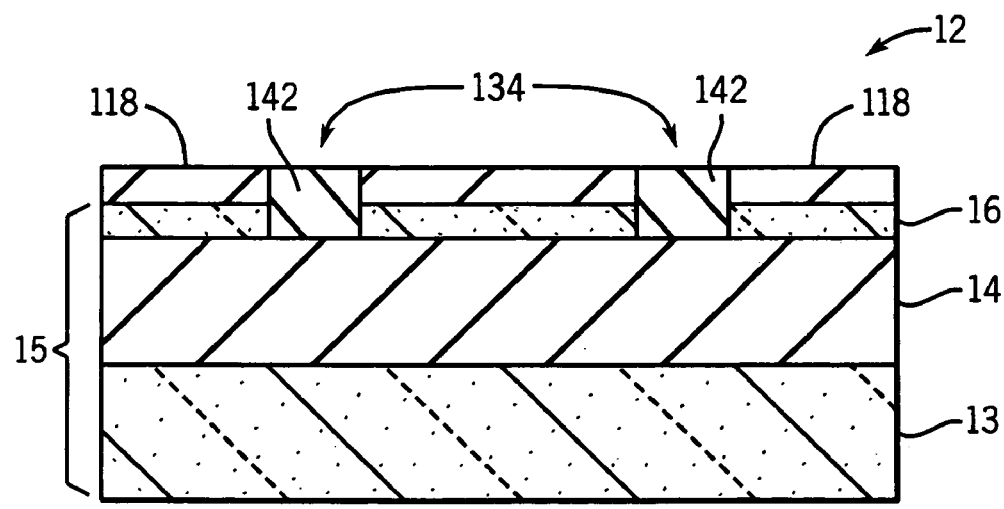
FIG. 12 is a cross-sectional view of the portion illustrated in FIG. 11, showing a trench fill step.

As shown in FIG. 12, in a step 207 of process 200, the trenches associated with apertures 134 are filled with insulative material 142. Insulative material 142 can be similar to insulative material 42 discussed with reference to FIG. 8. The trenches associated with apertures 134 can be filled in a variety of processes, including the processes described above with reference to filling the trenches associated with apertures 34. The insulative material fills the trench to an upper surface of mask layer 118. According to an exemplary embodiment, the insulative material is also provided over the surface of mask layer 118 and polished or etched back to the surface of mask layer 118.

Figure 13:
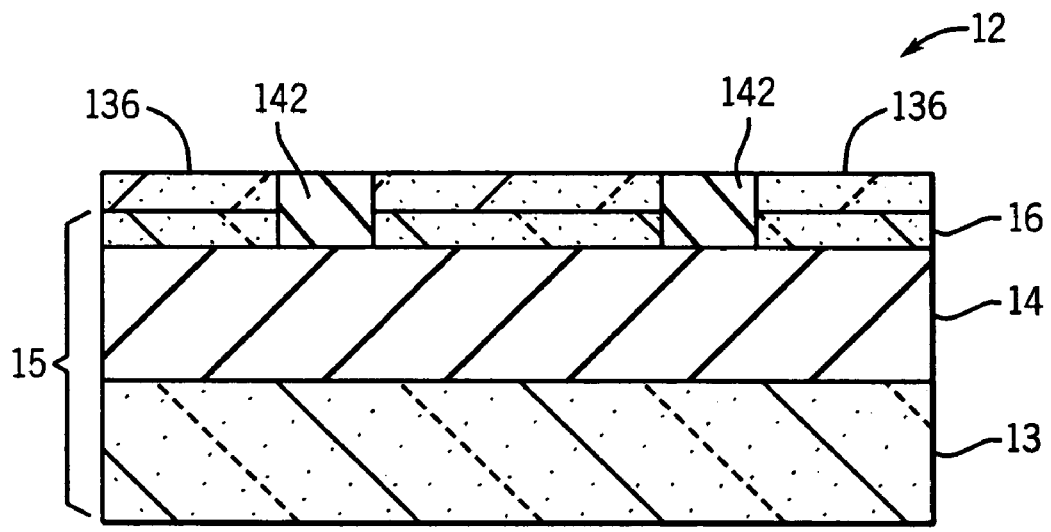
FIG. 13 is a cross-sectional view of the portion illustrated in FIG. 12, showing a strained silicon formation step.

As shown in FIG. 13, in a step 209 of process 200, the mask layer 118 is removed and a strained material 136 is grown by selective silicon epitaxy above layer 16. Because the thickness of layers 118 and 136 are substantially similar, the insulative material 142 extends to an upper surface of the strained material 136. Unlike the embodiment of process 100 discussed with reference to FIGS. 1-10, material 136 is not provided on sidewalls associated with the trench.

Figure 14:
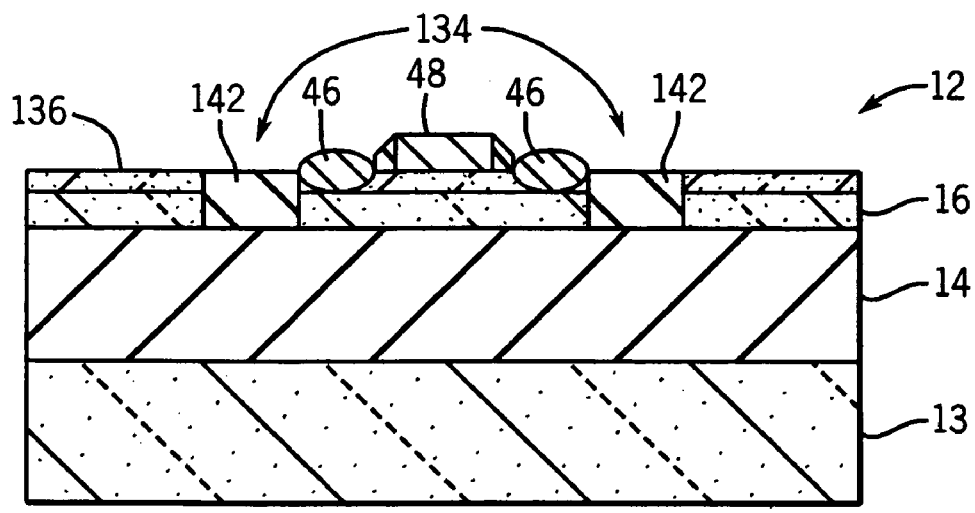
FIG. 14 is cross-sectional view of the portion illustrated in FIG. 13, showing a gate formation and silicidation step.
Figure 15:
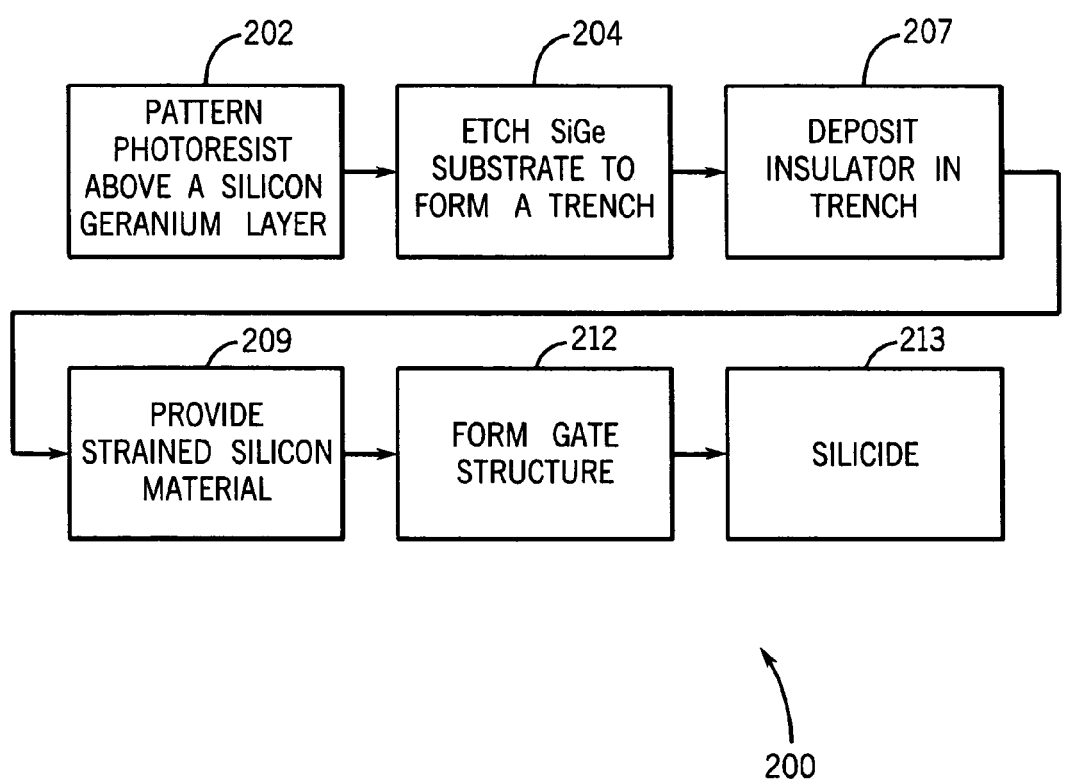
FIG. 15 is a general block diagram showing a shallow trench isolation process for the portion illustrated in FIGS. 1-5 and 11-14.

With reference to FIG. 14, a gate structure 48 is provided and silicide layer 46 is provided at the locations associated with the source and drain of the transistor associated with gate structure 48. Gate structure 48 is formed in a step 212 and a silicide layer 46 is formed in a step 213.

It should be understood that while the detailed drawings, specific examples, and particular values given provide a preferred exemplary embodiment of the present invention, it is for the purpose of illustration only. The shapes and sizes of trenches are not disclosed in a limiting fashion. The method and apparatus of the invention is not limited to the precise details and conditions disclosed. Various changes may be made to the details disclosed without departing from the scope of the invention, which is defined by the following claims.

What is claimed is:

1. A method of manufacturing an integrated circuit comprising:
   forming trenches in a substrate comprising a germanium-containing layer;
   providing a strained semiconductor material above the germanium-containing layer and on sidewalls of the trenches; and
   providing insulative material in the trenches to form trench isolation regions.

2. The method of claim 1, wherein the strained semiconductor material is formed on the sidewalls of the trenches.

3. The method of claim 1, further comprising siliciding the strained semiconductor material.

4. The method of claim 1, wherein the germanium-containing layer comprises a silicon-germanium material.

5. The method of claim 1, wherein the strained semiconductor material comprises strained silicon.

6. The method of claim 1, wherein the insulative material comprises silicon dioxide.

7. The method of claim 1, further providing a first layer above a buried oxide layer.

8. The method of claim 7, wherein the trenches extend through the germanium-containing layer to the buried oxide layer.

9. A method of producing an integrated circuit comprising:
   forming a trench having sidewalls in a substrate comprising a silicon-germanium layer;
   forming a strained silicon material above the silicon-germanium layer and on the sidewalls of the trench; and
   filling the trench with an insulative material to form a trench isolation region.

10. The method of claim 9, wherein the strained silicon material is formed on sidewalls of the trench.

11. The method of claim 9, further comprising siliciding the strained silicon material.

12. The method of claim 9, wherein the trench extends through the silicon-germanium layer to an underlying buried oxide layer.

* * * * *

UNITED STATES PATENT AND TRADEMARK OFFICE
CERTIFICATE OF CORRECTION

| | | |
|---|---|---|
| PATENT NO. | : 7,462,549 B2 | Page 1 of 1 |
| APPLICATION NO. | : 10/755602 | |
| DATED | : December 9, 2008 | |
| INVENTOR(S) | : Xiang et al. | |

It is certified that error appears in the above-identified patent and that said Letters Patent is hereby corrected as shown below:

On the Title page,

[*] Notice:   Subject to any disclaimer, the term of this patent is extended or adjusted under 35 USC 154(b) by 216 days.

Delete the phrase "by 216 days" and insert -- by 430 days --

Signed and Sealed this

Twenty-seventh Day of April, 2010

David J. Kappos
*Director of the United States Patent and Trademark Office*